(12) United States Patent  
Akaogi

(10) Patent No.: US 7,986,579 B2  
(45) Date of Patent: Jul. 26, 2011

(54) MEMORY DEVICE AND METHOD THEREOF

(75) Inventor: Takao Akaogi, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 578 days.

(21) Appl. No.: 12/030,485

(22) Filed: Feb. 13, 2008

(65) Prior Publication Data

US 2009/0201724 A1 Aug. 13, 2009

(51) Int. Cl.
*G11C 7/04* (2006.01)

(52) U.S. Cl. ............ 365/211; 365/185.2; 365/185.18; 365/207

(58) Field of Classification Search .......... 365/211, 365/204, 185.17, 185.01, 185.2, 185.18, 365/207

See application file for complete search history.

(56) References Cited

U.S. PATENT DOCUMENTS

| | | | |
|---|---|---|---|
| 6,275,419 B1 * | 8/2001 | Guterman et al. | 365/185.29 |
| 6,870,766 B2 * | 3/2005 | Cho et al. | 365/185.03 |
| 7,471,567 B1 * | 12/2008 | Lee et al. | 365/185.21 |
| 7,471,582 B2 * | 12/2008 | Choy et al. | 365/211 |

* cited by examiner

*Primary Examiner* — Pho M Luu  
*Assistant Examiner* — Tha-O Bui

(57) ABSTRACT

A device, and corresponding method, includes a temperature dependent bias generator to generate a voltage that is applied to a control gate of a sense amplifier. By applying the temperature dependent bias signal to the sense amplifier, a substantially temperature independent discharge time can be achieved at a sense node of a sense amplifier.

20 Claims, 5 Drawing Sheets

US 7,986,579 B2

MEMORY DEVICE AND METHOD THEREOF

FIELD OF THE DISCLOSURE

The present disclosure relates generally to electronic devices and more particularly to electronic devices having memories.

DESCRIPTION OF THE RELATED ART

Semiconductor memories can be categorized as volatile memories and non-volatile memories. A specific type of non-volatile memory is referred to as a "flash memory," which can be erased on a given-area basis with a reduced writing time. FIG. 1 illustrates a sense amplifier portion of a memory in accordance with the prior art that can be used to read a flash memory, such as a NAND flash memory.

During a pre-charge portion of a read access, the two switches illustrated in FIG. 1 are closed to so that the bit line BL, which has a capacitance $C_L$, is charged to a precharge voltage V_pc while the sense node SN is charged to $V_{CC}$. During a discharge portion of the read access the switches are open and a fixed gate voltage Vg is applied to the gate of the transistor of the sense amplifier of FIG. 1 at the same time that the bit cell, which is represented by the current source having current $I_C$, is selected. The voltage Vg is set equal to V_pc–V_delta–Vt, where V_pc is the pre-charge voltage, V_delta is a fixed voltage, and Vt is the threshold voltage of the transistor of FIG. 1. The current $I_C$ represents the current that is passed through a selected memory cell when selected. Therefore, the current $I_C$ can represent the current through a selected memory cell that is in either a conductive or non-conductive state. Note that the term "conductive state" is used with respect to a memory cell to indicate that the memory cell is configured to be in its more conductive state when selected, as opposed to the term "non-conductive state" which is used to indicate a memory cell is configured to be in its less conductive state when selected.

In order for the memory cell to be detected as being in its conductive state, it is necessary to remove sufficient charge from the bit line BL during a read operation to turn on the sense amplifier transistor, thereby allowing the sense node SN of FIG. 1 to discharge sufficiently to allow a low voltage to be detected by a sense device (not illustrated). Therefore, the necessary time for the sense amplifier transistor to be turned on is defined by $T = C_L * Vdelta * 1/Ic$. However, since the gate voltage Vg is a fixed voltage, changes in Vt of the transistor of FIG. 2 will result in the transistor turning on at a time that varies with temperature, which results in the node SN being discharged by a variable amount of time as well. As semiconductor devices are scaled to smaller geometries, it can become increasingly difficult to select an appropriate value of Vg that will work over a wide rage of temperature ranges.

BRIEF DESCRIPTION OF THE DRAWINGS

The present disclosure may be better understood, and its numerous features and advantages made apparent to those skilled in the art by referencing the accompanying drawings.

DETAILED DESCRIPTION

In accordance with a specific embodiment of the present disclosure, a sense node of a sense amplifier and a bit line of a memory array are charged during a pre-charge portion of a first time period. A first gate signal, which is dependent upon temperature, is provided to the control gate of a sense transistor of the sense amplifier during a discharge portion of the first time period. For a given state of a memory cell being read, the sense node of the sense amplifier can discharge for a period of time that is based upon a voltage of the gate signal. For example, if a memory cell being read is in its conductive state, the sense transistor will turn on for a period of time during the read cycle that is sufficiently long to substantially discharge the sense node, whereby a low-voltage logic signal is generated at the sense node. Alternatively, if a bit cell being read is in its non-conductive state, the sense transistor will either not turn on at all during the discharge portion, or turn on for a period of time during the discharge portion that is not sufficiently long to substantially discharge the sense node, whereby a high-voltage logic signal is remains at the sense node. Specific embodiments of the present disclosure will be better understood with respect to FIGS. 2-10.

Figure 1:
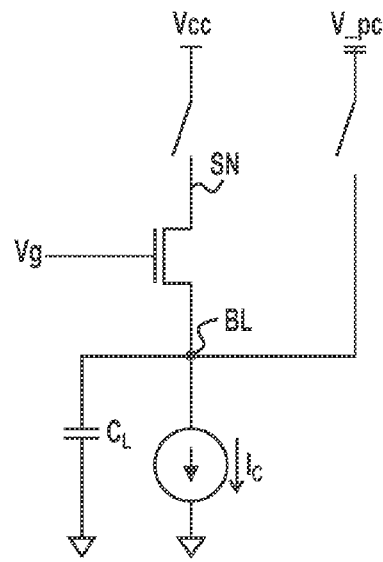
FIG. 1 illustrates a combination block and circuit diagram in accordance with the prior art.
Figure 2:
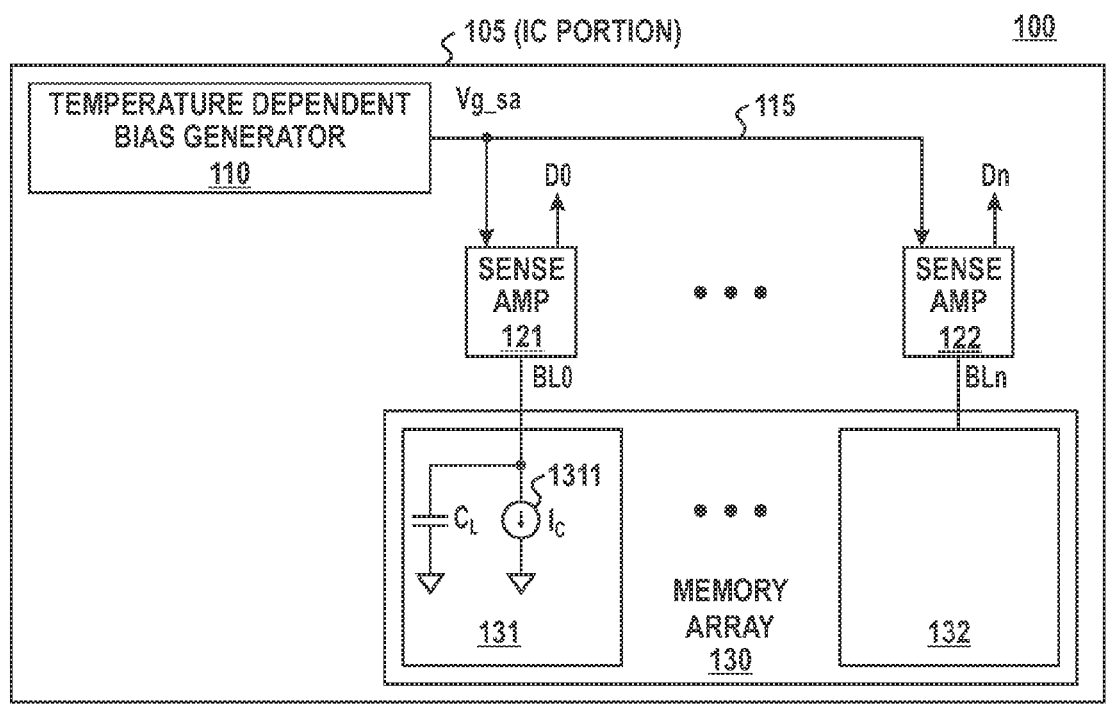
FIG. 2 illustrates a block diagram of a device including an integrated circuit in accordance with the present disclosure.

FIG. 2 illustrates an electronic device 100 having a non-volatile memory at an integrated circuit portion 105 that includes a temperature dependent bias generator 110, a sense amplifier 121, a sense amplifier 122, and a memory array 130. The electronic device 100 can be data processor, such as a computer or integrated circuit that includes the integrated circuit portion 105.

The sense amplifier 121 and the sense amplifier 122 are two of a plurality of sense amplifiers connected to the temperature dependent bias generator 110 via a node 115. The plurality of sense amplifiers is connected to memory array 130. For example, sense amplifier 121 is connected to the memory array 130 through a node referred to as a bit line, and labeled "BL0," and sense amplifier 122 is connected to memory array 130 through a bit line labeled "BLn." It will be appreciated that "n" represents an integer indicating the number of bit lines associated with the memory array 130.

During operation, the temperature dependent bias generator 110 generates a voltage labeled "Vg_sa" that is provided to the sense amplifier 121 and to the sense amplifier 122. The voltage Vg_sa is dependent upon the temperature at a location of the integrated circuit portion 105 where the temperature dependent bias generator 110 resides. Therefore, the value of Vg_sa will change as the temperature at this location changes. For example, a rise in temperature can result in Vg_sa having a lower voltage. By varying the voltage Vg_sa with temperature as the voltage threshold of transistors at the sense amplifiers 121 and 122 that control the discharge of their respective sense nodes also change with temperature, the amount of discharge variance at the sense nodes during a discharge cycle can be reduced. This reduction in discharge variance at a sense node, when compensated as described herein, is expected to be one-half the discharge variance over temperature when the voltage Vg_sa is not temperature compensated. This reduction in discharge variance allows a sense node of a sense amplifier to be discharged during a read access in a manner that is referred to herein as being substantially independent of temperature. This variance, being substantially independent of temperature, results in an amount of time from the start of a discharge portion of a read cycle until a time a transistor of the sense amplifier begins discharging the sense node that is referred to as being substantially the same for all operating temperatures, for a give logic state. Therefore, the duration of time during which a sense node is discharged for a given logic state is substantially the same for all operating temperatures. It will be appreciated that discharging a sense node by substantially the same amount facilitates accurate detection of logic levels at the sense nodes.

Each of the bit lines BL0-BLn of memory array 130 is connected to corresponding sense amplifiers 121-122. For example, as illustrated in FIG. 2, bit line BL0 connects sense amplifier 121 to portion 131 of memory array 130 that includes memory cells connected to the bit line BL0. A specific memory cell being read during a read cycle is represented as current source 1311 in FIG. 2 and has a current $I_C$. The current $I_C$ represents the current that is passed through a selected memory cell when selected. Therefore, the current $I_C$ can represent the current through a selected memory cell that is either in a conductive or non-conductive state.

Figure 3:
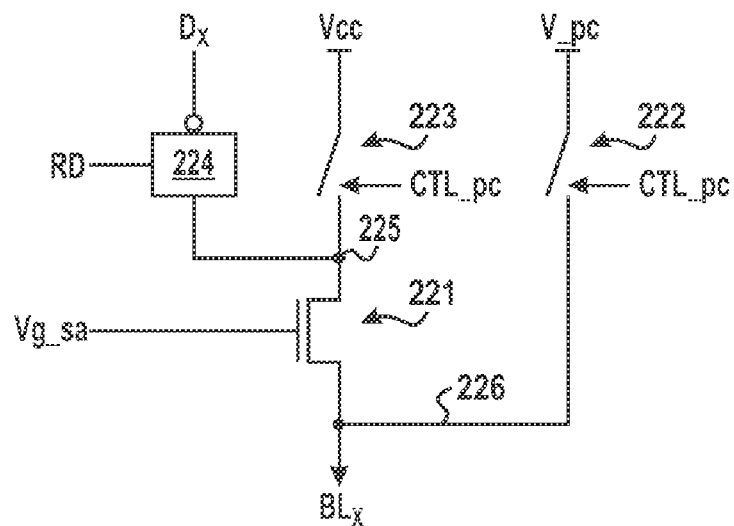
FIG. 3 illustrates a more detailed view of a sense amplifier of FIG. 2 in accordance with a specific embodiment of the present disclosure.

FIG. 3 illustrates a combination block and circuit diagram of a portion of a sense amplifier. Sense amplifiers 121-122 of FIG. 3 can be implanted based on the sense amplifier of FIG. 2. Specifically, FIG. 3 illustrates a transistor 221, a switch 222, a switch 223, and a latch 224.

Transistor 221 includes a first current electrode connected to a sense node 225, a second current electrode connected to a bit line labeled $BL_X$, and a control electrode connected to receive the signal Vg_sa. The switch 222 has a first current electrode connected to a voltage reference node at a pre-charge voltage labeled "V_pc," a second current electrode connected to the second current electrode of transistor 221, and a control electrode connected to receive a control signal labeled "CTL_pc" that is capable of opening or closing switch 222 to selectively electrically connect the first current electrode to the second current electrode. Switch 223 includes a first current electrode connected to a voltage reference node at a voltage reference VCC, a second current electrode connected to the sense node 225, and a control electrode connected to receive the control signal CTL_pc that is capable of opening or closing a switch 223 to selectively electrically connect the first current electrode to the second current electrode. A latch 224 has an input connected to the sense node 225, and provides at its output, Dx, an inverted representation of a signal at its input in response to a signal labeled "RD" being asserted. The latch 224 can be an edge-triggered latch or a level-sensitive latch. For purposes of discussion herein, latch 224 is assumed to be a positive edge triggered latch. Operation of the device of FIG. 2, and more particularly operation of the sense amplifier of FIG. 3 in response to receiving the temperature dependent signal Vg_sa during a read access will be better understood with reference to FIG. 4.

Figure 4:
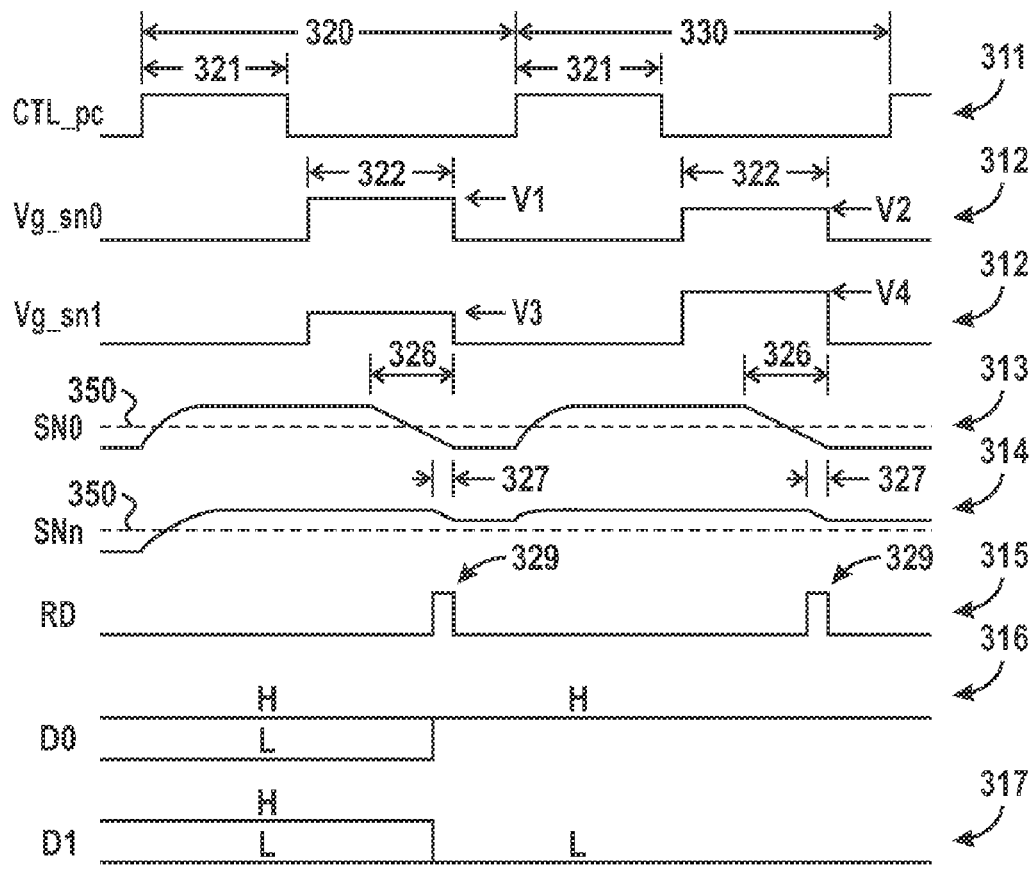
FIG. 4 illustrates a timing diagram relating to a specific embodiment of the device of FIG. 2.

FIG. 4 illustrates a timing diagram including waveforms 311-317 in accordance with a specific embodiment of the present disclosure. Waveform 311 represents signal CTL_pc, which represents the control signal received at the control electrodes of the switches 222 and 223 illustrated at FIG. 3. Waveform 311 is asserted to close switches 222 and 223 during a pre-charge portion of a period of time referred to as a read access cycle. Waveform 312 represents signal Vg_sa, which is received at the control gate of transistor 221 of each sense amplifier of FIG. 3, and is asserted during a discharge portion of a read access period during which a memory cell is selected. Waveform 313 represents a signal SN0, which is the voltage at the sense node 225 of the sense amplifier 121 of FIG. 2. Waveform 314 represents a signal SN1, which is the voltage at the sense node of a second sense amplifier (not illustrated) of device 100 of FIG. 2. Waveform 315 represents a signal RD which controls when latch 224 of each sense amplifier latches data at its respective sense node. Waveform 316 represents a signal D0, which represents the logic output from the latch 224 associated with the sense amplifier 121 of FIG. 2. Waveform 317 represents a signal Dn, which represents the logic output from a sense amplifier 122.

The timing diagram of FIG. 4 includes two time periods: timing period 320, and timing period 330. These timing periods are also referred to as read access cycles during which first and second read accesses are preformed.

During a pre-charge portion 321 of time period 320, the sense node and bit line associated with each sense amplifier are charged in response to the assertion of signal CTL_pc. As a result, during the pre-charge portion 321 of the first time period 320, the voltage of the bit lines will be charged to the voltage V_pc, while the voltage at the sense nodes 225 will be charged to the voltage Vcc. For example, referring to FIGS. 2 and 3, it will be appreciated that the asserted signal CTL_pc during portion 321 causes the switches 222 and 223 to be closed. When closed the sense nodes 225 are connected to the voltage Vcc and the waveforms 313 and 314 representing the voltage SN0 at sense node 225 of sense amplifier 121 and the waveform 314, the voltage SN1 at sense node 225 of an adjacent sense amplifier, respectively, are pre-charged to Vcc. Similarly, the bit lines of other sense amplifiers including sense amplifier 122 will be charged to V_pc during the pre-charge portion 321. The read signal, RD, is negated during the pre-charge portion 321 of time period 320. The output signals D0 and D1 maintain their previous state, which can be a logic level high (H) or a logic level low (L), during the pre-charge portion 321 of the first time period 320.

A discharge portion 322 of time period 320 occurs following the pre-charge portion 321. The discharge portion 322 can begin at or after completion of the pre-charge portion 321. As specifically illustrated in FIG. 4, there can be a short period of time between completion of the pre-charge portion 321 and the beginning of the discharge portion at time 322.

During the discharge portion 322, a read voltage is applied to a memory cell of each bit line being read that results in the bit cell being in a conductive state, referred to as an "on state", or a in a non-conductive state, referred to as an "off-state." When a memory cell is in an on state, the current $I_c$ is greater than when the memory cell is in an off state, thereby discharging its respective bit line at a faster rate. The transistor 121 of a sense amplifier will remain off during discharge portion 322 until the voltage at the bit line is discharged to a voltage that is one Vt below the voltage Vg_sa. When this occurs, the transistor 121 turns on and begins to discharge the sense node 225.

In operation, during discharge portion 322, a temperature dependent gate signal Vg_sa is asserted to bias the transistor 221 of each sense amplifier, such as sense amplifiers 121 and 122. The value of the voltage of signal Vg_sa is based upon a temperature at a location of the integrated circuit 100 where the temperature dependent bias generator 100 resides. In one embodiment, the signal Vg_sa is continuously updated based upon temperature, in other embodiments the value Vg_sa can be periodically updated based upon temperature and latched for use by the system. In one embodiment, a change in temperature that lowers the voltage threshold of a transistor, such as transistor 221 of a sense amplifier, will result in generating Vg_sa at a lower voltage to ensure transistor 221 turns on at substantially the same time relative the beginning of the discharge portion 322 over the change in temperatures. Therefore, if a temperature at the temperature dependent bias generator 110 were to increase, thereby causing a lowering of the voltage threshold of a transistor within the temperature dependent bias generator 110, the signal Vg_sa would be lowered, as compared to the cooler temperature, to bias transistor 221. It will be appreciated that if the signal Vg_sa where fixed, i.e., not temperature dependent, an increase in temperature that lowers the Vt of a transistor 221 would result in transistor 221 turning on at a later time as temperature increases.

During portion 326 of the discharge portion 322, the signal SN0, which represents a voltage at the sense node 225 of sense amplifier 121, discharges in response to transistor 221 being turned on. As previously discussed, transistor 221 is turned on when bit line BL0 discharges to a voltage that is one Vt below Vg_sa. The discharge time 326 represents the time that transistor 221 is turned on during discharge portion 326. Therefore, the discharge time 326 is long enough to allow sufficient current to flow from the sense node 225 to discharge sense node 225 to a voltage less than a voltage 350 to facilitate the latch 224 being able to detect a low logic level at its input.

During portion 327 of the discharge portion 322, the signal SN1, which represents a voltage at the sense node of the sense amplifier 122, discharges in response to its transistor 221 being turned on. As previously discussed, transistor 221 is turned on when bit line BLn discharges to a voltage that is one Vt below Vg_sa. The discharge time 327 represents the time that transistor 221 is turned on in response to a corresponding memory cell that is being read being in its non-conductive state. Therefore, the discharge time 326, if any, is short enough to prevent the voltage at the sense node 225 from dropping below voltage 350 prior to the charge at the sense node being read. This allows the latch 224 of sense amplifier 121 to detect a high logic level at its input when the read signal RD is asserted.

The discharge time 326 represents a discharge time of a sense node through a corresponding transistor 221 connected to a bit line BL0 that is being discharged to ground through a memory cell in its conductive state. Because Vg_sa is dependent upon temperature, the discharge time 326 is substantially independent of temperature. The discharge time 327 represents a discharge time of a sense node through a corresponding transistor 222 that is in turn connected to a bit line BLn being discharged to ground through a memory cell in its non-conductive state. Because Vg_sa is dependent upon temperature, the discharge time 327 is substantially independent of temperature. As used herein with respect to discharge time, the term "substantially independent of temperature" is intended to mean that the time that a sense node is discharged during a discharge cycle, for a give state, varies less over operating temperatures than the variance of the discharge time the same sense node over the same temperature if controlled by a fixed gate voltage. Therefore, by varying the voltage level of signals VG_sa0 with temperature, the time when the sense node SN0 begins discharging remains substantially the same, relative the beginning of time period 320, for all temperatures. As a result, the sense node SN0 will discharge by substantially the same amount, for a given logic state independent of temperature.

The read signal RD remains negated for at least an initial portion of the discharge portion 322 of time period 320. Data out signals D0 and D1 are not affected during the discharge period 320 prior to assertion of the read signal RD. A read pulse 329 is generated at the read signal RD during the first time period 320. In response to assertion of the read pulse 329, a first logic state of the sense amplifier is determined based upon the charge at its sense node 225. It will be appreciated that the charge at the sense node is based upon an amount of charge remaining at the sense node at the time of the pulse 329 is asserted. Therefore, the voltage of the sense node is based upon the amount of charge removed from the sense node during the discharge portion of the first time period that occurred prior to the read pulse 329. As a result, the signal SN0, which is less than the reference voltage 350 at the time pulse 329 is asserted, is latched, resulting in the high-level logic signal (H) at output D0. Conversely, the signal SN1, which is greater than the reference voltage 350 at the time the pulse 329 is asserted, results in a logic level low being latched.

During the second timing period 330, the $I_C$ portion 105 of FIG. 2 operates in a similar manner as during first timing period 320. However, during the discharge portion 322 of timing period 330 the temperature dependent bias generator 110 generates the signal Vg_sa0 based upon a different temperature than during time period 320. Therefore, during the discharge portion 322 of the timing period 330 signal Vg_sa0 has an asserted voltage value V2 that is different than the voltage value V1 of Vg_sa0 that is asserted during the discharge portion 322 of the first timing portion 320. This variation in the voltage value of Vg_sa0 compensates for the variation in operation of the sense amplifiers due to a similar change in temperature. Therefore, assuming the data values being read from memory cells at the sense amplifiers do not change between the first timing period 320 and the second timing period 330, the portion 326 of the second timing period 330 has a duration that is substantially the same as the portion 326 of the first timing period 320 at sense amplifier 121, and the portion 327 of the second timing portion 331 has a duration that is substantially the same as the portion 327 of the first timing portion 321, at the sense amplifier adjacent to sense amplifier 121.

Figure 5:
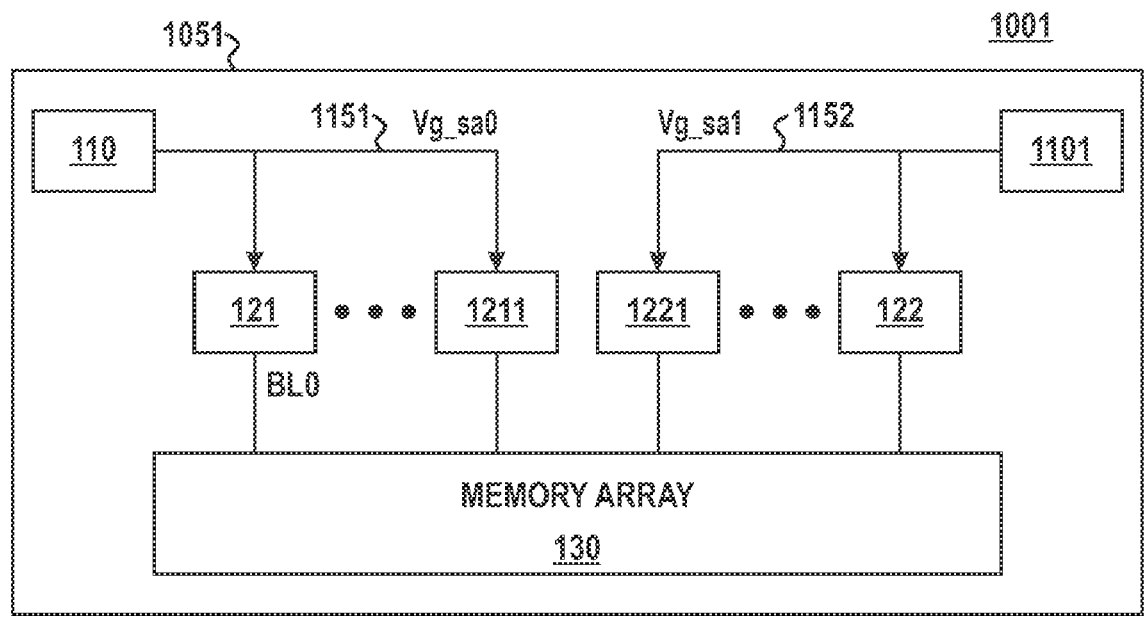
FIG. 5 illustrates a block diagram of a device including an integrated circuit in accordance with a specific embodiment of the present disclosure.

FIG. 5 illustrates an electronic device 1001 having a non-volatile memory at an integrated circuit portion 1051 that is similar to the integrated circuit portion 105 of FIG. 2. In particular, IC portion 1051 includes a temperature dependent bias generator 110, a sense amplifier 121, a sense amplifier 122, and a memory array 130 similar to those previously described. In addition, IC portion 1051 of FIG. 5 includes a second temperature dependent bias generator 1101 that operates separate from, but in a similar manner as, temperature dependent bias generator 110. Identically numbered elements in FIG. 5 operate as previously discussed. The electronic device 1001 can be data processor, such as a computer or integrated circuit that includes the integrated circuit portion 1051 having the specifically illustrated devices.

The use of a plurality of temperatures bias generators as illustrated allows for the IC portion 1051 to compensate for temperature differences across a common integrated circuit substrate. Therefore, in the illustrated embodiment, sense amplifiers 121-1211 have their respective sense amplifier transistors biased by signal Vg_sa0, which is transmitted over node 1151, and sense amplifiers 1221-122 have their respective sense amplifier transistors biased by signal Vg_sa1, which is transmitted over node 1152. It will be appreciated that the closer a temperature bias generator is to a sense amplifier that it biases, the more likely the temperature bias generator and the sense amplifier being biased will be exposed to a similar temperature, thereby improving compensation. While two temperature bias generators 110 and 1101 are shown in FIG. 5, it will be appreciated that additional temperature bias generators can be implemented. For example, a separate temperature bias generator could be implemented for each sense amplifier.

Figure 6:
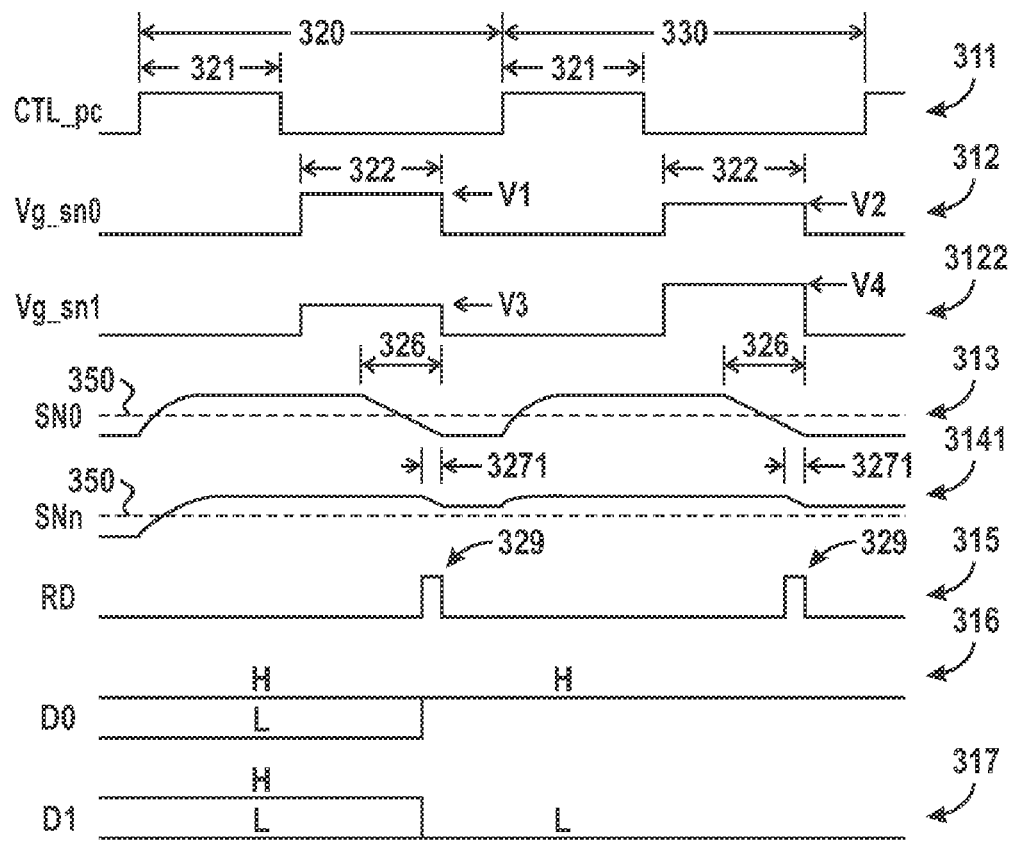
FIG. 6 illustrates a timing diagram relating to a specific embodiment of the device of FIG. 5.

The timing diagram of FIG. 6 is similar to the timing diagram of FIG. 4, and applies to the device 1001 of FIG. 5. Identically numbered elements in FIG. 6 function as previously described.

In addition to the elements previously illustrated and described, the timing diagram FIG. 6 includes waveform 3122 and waveform 3141. Waveform 312 continues to represent signal Vg_sa0, which is received at the control gate of a respective transistor of each of the sense amplifiers 121-1211, and is asserted during a discharge portion of a read access period. Waveform 3122 represents signal Vg_san, which is received at the control gate of a respective transistor of each of the sense amplifiers 1221-122, and is asserted during a discharge portion of a read access period. Waveform 3141 represents a signal SNn, which is the voltage at the sense node of the sense amplifier 122 of device 100 of FIG. 2 in response to the signal Vg_san.

During the first time period 320, signal Vg_sa0 is the same as that previously described. However, signal Vg_sa1 has a different voltage level, V3, than Vg_sa0 due to its being located at a different physical location of IC portion 1051 having a different temperature. As a result, the portion 3271 of the first time period 320 is different than the portion 327 as discussed previously at FIG. 4. Since the sense amplifier 122 in FIG. 5 is closer to the temperature dependent bias generator 1102 than sense amplifier 122 was to temperature dependent bias generator in FIG. 3, it is likely that portion 3271 represents a discharge time of the sense node that compensates sense amplifier 122 for temperature more accurately than temperature dependent bias generator 110 did as previously discussed with respect to FIG. 4.

During the second time period 330 of FIG. 6, the voltage value of signal Vg_sa1 has changed to V4. However, the portion 3271 remains substantially the same due to the temperature compensation provide by temperature dependent bias generator 1101 as previously discussed.

Figure 7:
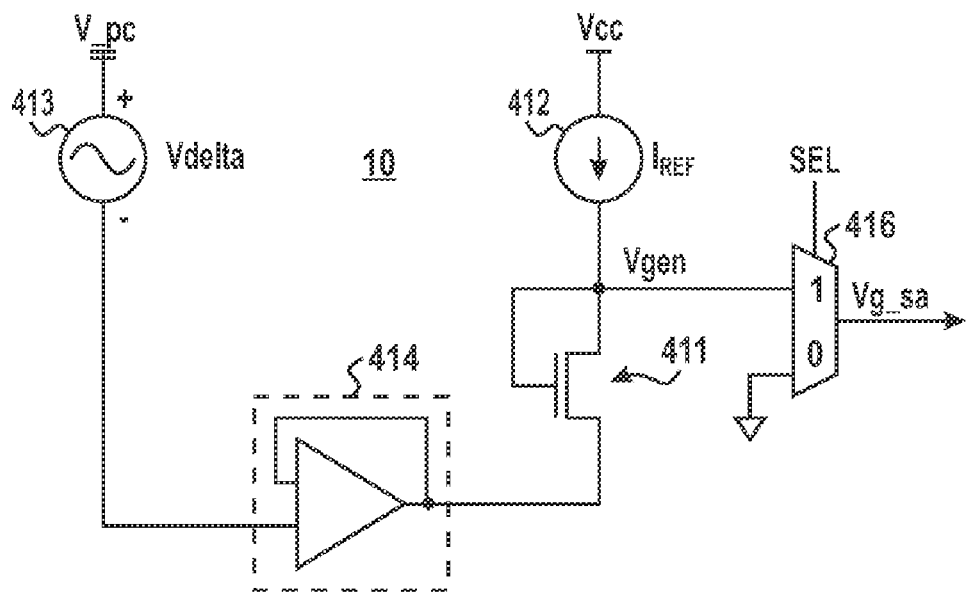
FIG. 7 illustrates a combination block and circuit diagram of a bias generator as illustrated in FIG. 2 in accordance with a specific embodiment of the present disclosure.

FIG. 7 illustrates a specific implementation of a temperature dependent bias generator that can be implemented as a previously described temperature dependent bias generator. The temperature dependent bias generator of FIG. 7 includes a voltage offset generator 413, a buffer 414, a transistor 411, a current reference 412, and a select module 416.

The voltage offset generator 413 has a positive terminal connected to a voltage reference node that is operable to provide voltage V_pc, and a negative terminal. Buffer 414 has an input connected to the negative terminal of the voltage offset generator 413 and an output. Buffer 414 can be specifically implemented using an operational amplifier having its output connected to its negative input. Transistor 411 includes a first current electrode, a second current electrode connected to the output of the buffer 414, and a control electrode connected to the first current electrode. Current reference 412 includes a first terminal connected to a voltage reference node that is operable to provide a voltage such as Vcc, and a second terminal connected to the first current electrode of transistor 411. Select module 416 includes a first input connected to the first current electrode of transistor 411, a second input connected to the reference voltage (GND), a control input connected to receive a signal SEL to selectively electrically connect one of the first input or the second input to an output to provide signal $V_{g\_sa}$.

During operation, the buffer 414 can operate as a unity gain buffer to provide a voltage, V_pc-Vdelta, at its output that matches the voltage at its input. The voltage Vdelta is a design parameter selected to control when a sense amplifier transistor, such as transistor 211 of FIG. 2, turns on to discharge a corresponding sense node. Current reference 412 provides a bias current at transistor 411 to ensure the desired voltage Vgen can be maintained. Transistor 411 can be matched to transistor 221 of the sense amplifiers to ensure that a temperature that affects the sense amplifiers affects the temperature dependent bias generator in a similar manner. Unlike the prior art, which uses a fixed voltage to bias the sense amplifiers, a temperature change at transistor 411 will cause a change in the Vt of transistor 411, which in turn will cause the value of Vgen to vary as previously discussed. The signal SEL is asserted at select module 416 to selectively electrically connect the temperature dependent signal Vgen to the output terminal of select module 416.

Figure 8:
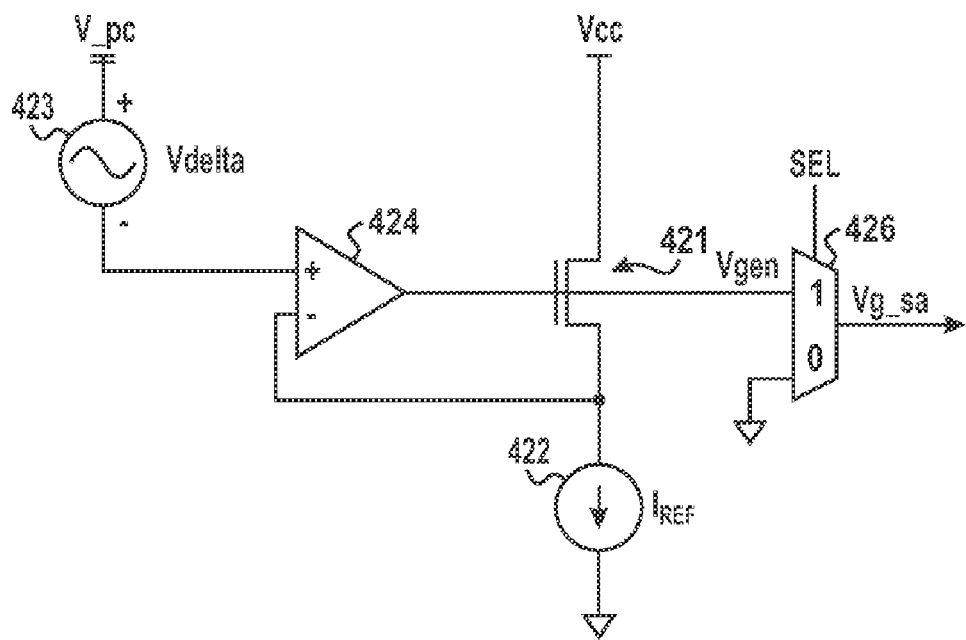
FIG. 8 illustrates a combination block and circuit diagram of an alternate bias generator as illustrated in FIG. 2 in accordance with a specific embodiment of the present disclosure.

FIG. 8 illustrates another specific implementation of a temperature dependent bias generator that can be implemented as a previously described temperature dependent bias generator. The temperature dependent bias generator of FIG. 8 includes a voltage offset generator 423, an amplifier 424, a transistor 421, and a current reference 422, and a select module 416.

The voltage offset generator 423 has a positive terminal connected to a voltage reference node that is operable to provide voltage V_pc, and a negative terminal. Amplifier 424 has a positive input connected to the negative terminal of the voltage offset generator 424 and an output. Transistor 421 includes a first current electrode connected to a voltage reference node that is operable to provide a voltage reference Vcc, a second current electrode connected to the negative input of amplifier buffer 424, and a control electrode connected to the output of buffer 424. Current reference 422 includes a first terminal connected to the second current electrode of transistor 421, and a second terminal connected to a voltage reference node that is operable to provide a voltage reference, such as ground, during operation. Select module 426 includes a first input connected to the first current electrode of transistor 421, a second input connected to the reference voltage (GND), a control input connected to receive a signal SEL to selectively electrically connect one of the first input or the second input to an output to provide signal $V_{g\_sa}$.

During operation, transistor 421 is part of feed back path that includes amplifier 424 such that the signal Vg_sa varies as the gate to source voltage of transistor 421 varies. As previously discussed, the voltage Vdelta is a design parameter selected to define the voltage Vgen at the first current electrode of the transistor 424. Current reference 412 provides a bias current to transistor 421 to ensure a desired voltage Vgen can be maintained during operation. Transistor 421 can be matched to transistor 221 of the sense amplifiers to ensure a temperature that affects the sense amplifier affects the temperature dependent bias generator in a similar manner. The signal SEL is asserted at select module 426 to selectively electrically connect the temperature dependent signal Vgen to the output terminal of select module 426.

Figure 9:
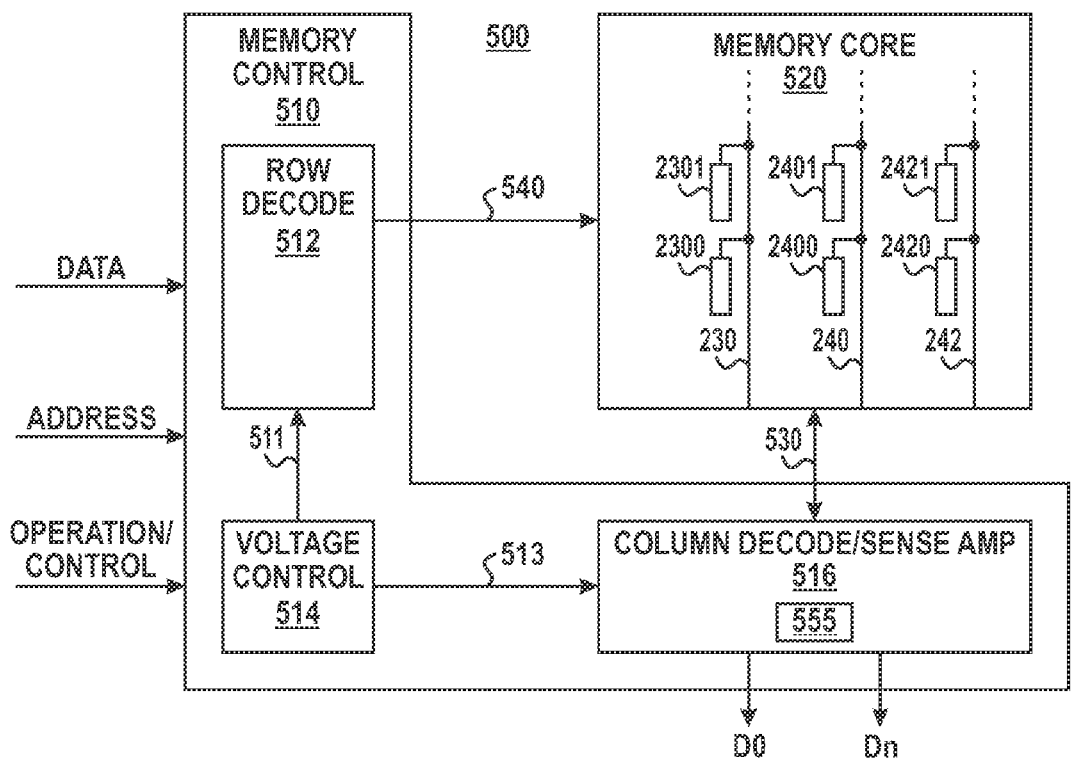
FIG. 9 illustrates a specific embodiment of memory device in accordance with the present disclosure.

FIG. 9 illustrates a block diagram of a system 500 that can be used to implement an integrated circuit containing the elements described with respect to FIGS. 2 and 5.

FIG. 9 illustrates a control module 512 and a memory core 520. Control module 510 includes a row decode module 512 connected to the set of row interconnects 540, a column decode/sense amp module 516 connected to the set of column interconnects 530, and a voltage control module 514 connected to the row decode module 512 and the column decode module/sense amp module 516 through interconnects 511 and 512. One of the interconnects 513 can include an interconnect that provides a signal generated from a temperature dependent bias generated as described above.

Memory core 520 includes a plurality of bit lines that delineate columns of NAND strings within memory core 520, including bit line 230, bit line 240, and bit line 242. Each bit line of the plurality of bit lines has a plurality of NAND strings, for example, connected thereto. For example, NAND strings 2300 and 2301 are connected to bit line 230, NAND strings 2400 and 2401 are connected to bit line 240, and NAND strings 2420 and 2421 are connected to bit line 242.

During operation, the row decode module 512 decodes OPERATION/CONTROL signals, and ADDRESS signals, to determine the output signals to be provided at row interconnects 540 for each NAND string of the memory core 520. Similarly, the column decode module 516 decodes OPERATION/CONTROL signals, ADDRESS signals, and DATA signals, to determine the output signals to be provided at column interconnects 530 for each bit line of the memory core 520. Based upon an operation being performed, the voltage control module 514 provides appropriate voltages, including Vg_sa as described above, to the row decode module 512 and to the column decode/sense amp module 516. In accordance with a specific aspect of the present disclosure, memory control module 510 can perform read, write, and erase operations at NAND storage cells, which are also referred to as NAND storage gates, and at the select gates of memory core 520.

Figure 10:
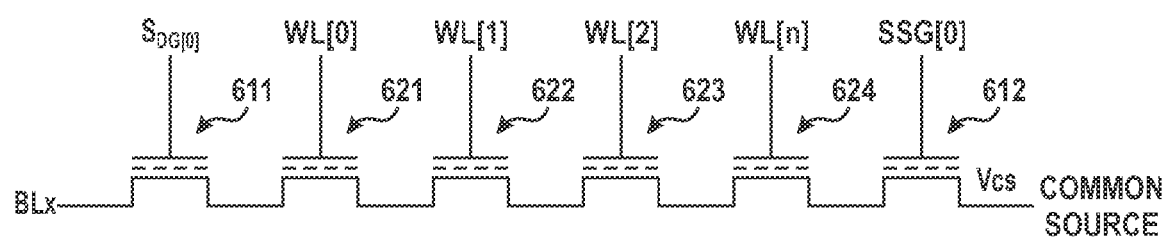
FIG. 10 illustrates a string of memory cells that can be used in accordance with a specific embodiment of the present disclosure.

FIG. 10 illustrates a schematic representation of an embodiment of a memory block referred t as a NAND string. The NAND string of FIG. 6 includes transistors 611, 612, and 621-624. Transistors 621-624 represent a string of NAND storage cells, also referred to as storage cells NAND[0 . . . N], whereby NAND storage cells[0-N] form a string of NAND storage cells, while transistors 611 and 612 represent select gates. Storage cell NAND[0], i.e., transistor 621, and storage cell NAND[N], i.e., transistor 624, represent the two outer NAND storage cells of the string of NAND storage cells, while storage cells NAND[1 . . . N–1] represent the interior storage cells of the string of NAND storage cells. The storage cell NAND[0] is the NAND storage cell of the sting of NAND storage cells most closely coupled to the local bit line interconnect $LBL_O[0]$. During a read access, one of the storage cells 611-623 has its gate biased to a read voltage, RD, while the remaining storage cells have are turned on. The resulting current through the storage cell being read is modeled as a current source at FIG. 2.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

Other embodiments, uses, and advantages of the present disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    charging a sense node of a first sense amplifier during a pre-charge portion of a first time period;
    generating a first gate signal based upon a first temperature;
    discharging the sense node based upon the first gate signal during the first time period for an amount of time; and
    determining, during the first time period, a first logic state based upon a first charge at the sense node remaining after discharging the sense node based upon the second gate signal for the amount of time.

2. The method of claim 1 wherein the first amount of time is substantially independent of temperature.

3. The method of claim 1 further comprising:
    charging the sense node of the first sense amplifier during a pre-charge portion of a second time period;
    generating a second gate signal based upon a second temperature;
    discharging the sense node based upon the second gate signal during the second time period for an amount of time;
    determining, during the second period, a second logic state based upon a second charge at the sense node remaining after discharging the sense node based upon the second gate signal for the amount of time.

4. The method of claim 3 wherein in response to the second temperature being greater than the first temperature the second gate signal will have a voltage less than a voltage of the first gate signal, and in response to the second temperature being less than the first temperature the second gate signal will have a voltage greater than a voltage of the first gate signal.

5. The method of claim 3 wherein the amount of time during the first time period is substantially the same as the amount of time during the second time period when the second temperature is substantially different than the first temperature.

6. The method of claim 1 wherein the first temperature is the temperature at a first location of an integrated circuit, and claim 1 further comprises:
    charging a sense node of a second sense amplifier during the pre-charge portion of the first time period;
        generating a second gate signal based upon a second temperature at a second location of the integrated circuit;
        discharging the sense node of the second sense amplifier based upon the second gate signal during the first time period for the amount of time;
        determining, during the first time period, a second logic state based upon a second charge at the sense node of the second sense amplifier, the second charge remaining after discharging the sense node of the second sense amplifier based upon the second gate signal for the amount of time.

7. The method of claim 6 wherein in the amount of time during the first time period is substantially the same as the amount of time during the second time period when the second temperature is substantially different than the first temperature.

8. The method of claim 1 wherein the first temperature is the temperature during the first time period.

9. The method of claim 1, wherein discharging further comprises discharging the sense node through a NAND flash.

10. A memory device comprising:
a temperature dependent signal generator comprising a first terminal to receive a reference signal, a transistor comprising a first current electrode, a second current electrode, and a control electrode electrically connected to the first current electrode, the first current electrode selectively electrically connected to a second terminal of the temperature dependent signal generator to provide a signal that is temperature dependent; and
a sense amplifier comprising
a sense node,
a sense device comprising an input connected to the sense node and an output to provide a logic state based upon a signal at the sense node, and
a transistor comprising a first current electrode electrically connected to the sense node, a second current electrode electrically connected to a bit line of a memory array, and a control gate electrically connected to the second terminal of the temperature dependent voltage reference generator.

11. The device of claim 10 wherein the sense amplifier is a first sense amplifier, and the bit line is a first bit line, the device of claim 1 further comprising:
a second sense amplifier comprising
a sense node,
a sense device comprising an input connected to the sense node and an output to provide a logic state based upon a signal at the sense node, and
a transistor comprising a first current electrode electrically connected to the sense node, a second current electrode electrically connected to a second bit line of the memory array, and a control gate electrically connected to the second terminal of the temperature dependent voltage reference generator.

12. The device of claim 10 further comprising a NAND string connected to the bit line.

13. The device of claim 10 wherein the temperature dependent signal generator is a first temperature dependent signal generator, the sense amplifier is a first sense amplifier, and the bit line is a first bit line, the device of claim 1 further comprising:
a second temperature dependent signal generator comprising a first terminal to receive the reference signal, and a second terminal to provide a signal that is temperature dependent; and
a second sense amplifier comprising
a sense node,
a sense device comprising an input connected to the sense node and an output to provide a logic state based upon a signal at the sense node, and
a transistor comprising a first current electrode electrically connected to the sense node, a second current electrode electrically connected to a second bit line of the memory array, and a control gate electrically connected to the second terminal of the second temperature dependent voltage reference generator.

14. The device of claim 13 further comprising a NAND string connected to the bit line.

15. The device of claim 10, wherein the temperature dependent signal generator comprises a transistor selectively electrically connected to the second terminal to provide the signal that is temperature dependent, the transistor of the temperature dependent signal generator being matched to the transistor of the sense amplifier.

16. The device of claim 15, wherein temperature dependent signal generator further comprises:
a fixed signal generator comprising a terminal electrically connected to the second current electrode of the transistor of the temperature dependent signal generator to provide a fixed signal reference; and
a signal reference comprising a terminal electrically connected to the first current electrode.

17. The device of claim 16 further comprising a NAND string connected to the bit line.

18. The device of claim 16 further comprising:
a pre-charge node to provide charge to the sense node in response to the device being in a pre-charge state, and electrically connected to the fixed signal generator, the fixed signal reference to be based upon a signal at the pre-charge node.

19. A memory device comprising:
a temperature dependent signal generator comprising a first terminal to receive a reference signal, a transistor comprising a first current electrode, a second current electrode, and a control electrode, and a differential amplifier comprising a first input, a second input electrically connected to the second electrode of the transistor, and an output electrically connected to the control electrode of the transistor, the output of the differential amplifier selectively electrically connected to a second terminal of the temperature dependent signal generator to provide a signal that is temperature dependent;
a sense amplifier comprising
a sense node,
a sense device comprising an input connected to the sense node and an output to provide a logic state based upon a signal at the sense node, and
a transistor comprising a first current electrode electrically connected to the sense node, a second current electrode electrically connected to a bit line of a memory array, and a control gate electrically connected to the second terminal of the temperature dependent voltage reference generator.

20. A memory comprising:
a first temperature dependent signal generator comprising a first terminal to receive a reference signal, and a second terminal to provide a signal that is temperature dependent; and
a first sense amplifier comprising
a sense node,
a sense device comprising an input connected to the sense node and an output to provide a logic state based upon a signal at the sense node, and
a transistor comprising a first current electrode electrically connected to the sense node, a second current electrode electrically connected to a first bit line of a memory array, and a control gate electrically connected to the second terminal of the first temperature dependent voltage reference generator;
a second temperature dependent signal generator comprising a first terminal to receive the reference signal, and a second terminal to provide a signal that is temperature dependent; and
a second sense amplifier comprising
a sense node, a sense device comprising an input connected to the sense node and an output to provide a logic state based upon a signal at the sense node, and a transistor comprising a first current electrode electrically connected to the sense node, a second current electrode electrically connected to a second bit line of the memory array, and a control gate electrically connected to the second terminal of the second temperature dependent voltage reference generator.

* * * * *